United States Patent
Soltz et al.

(10) Patent No.: US 7,560,703 B1
(45) Date of Patent: Jul. 14, 2009

(54) INTEGRATED SEGMENTED SCINTILLATION DETECTOR

(75) Inventors: David A. Soltz, San Jose, CA (US); Ye Yang, Fremont, CA (US); Mark C. Lin, San Jose, CA (US); Laurence S. Horndon, Santa Clara, CA (US); Edward G. Solomon, Menlo Park, CA (US); Joseph A. Heanue, Palo Alto, CA (US); John F. Heanue, Manchester, MA (US); M. Nasser Ghodsi, Hamilton, MA (US)

(73) Assignee: KLA-Tencor Corporation, Milpitas, CA (US)

( * ) Notice: Subject to any disclaimer, the term of this patent is extended or adjusted under 35 U.S.C. 154(b) by 267 days.

(21) Appl. No.: 11/772,301

(22) Filed: Jul. 2, 2007

Related U.S. Application Data

(60) Provisional application No. 60/939,235, filed on May 21, 2007.

(51) Int. Cl.
*H01J 37/244* (2006.01)

(52) U.S. Cl. .................. 250/397; 250/310

(58) Field of Classification Search .............. 250/397, 250/310
See application file for complete search history.

(56) References Cited

U.S. PATENT DOCUMENTS

| | | | |
|---|---|---|---|
| 6,211,525 B1 * | 4/2001 | Cowham | 250/484.2 |
| 6,781,124 B2 * | 8/2004 | Hayn | 250/310 |
| 7,247,849 B1 * | 7/2007 | Toth et al. | 250/307 |

* cited by examiner

*Primary Examiner*—Kiet T Nguyen
(74) *Attorney, Agent, or Firm*—Luekeda, Neely & Graham, P.C.

(57) ABSTRACT

A signal conduction channel having a first element that receives electrons at a first end from a vacuum environment, produces photons as the electrons are received, and propagates the photons along a length of the first element to a distal second end, and a second element that receives the photons from the second end of the first element, converts the photons to electrons, and multiplies the electrons, where no additional element is disposed between the second end of the first element and the second element, except optionally at least one of a photon-conductive epoxy, a lens, and an optical coupling plate that touches both the second end of the first element and the second element.

23 Claims, 1 Drawing Sheet

INTEGRATED SEGMENTED SCINTILLATION DETECTOR

FIELD

This invention relates to the field of scintillation detection. More particularly, this invention relates to reducing signal to noise losses in the scintillation channel of an instrument.

BACKGROUND

Instruments such as x-ray detection devices and scanning electron microscopes make use of scintillation crystals to receive and detect high energy particles, such as secondary electrons. The particular case of scanning electron microscopes will be generally used throughout this disclosure, but it is appreciated that this is by way of example only, and that other devices that make use of scintillation detection channels are also comprehended hereunder.

A scanning electron microscope operates by directing a beam of electrons onto the surface of an object under investigation, such as a substrate upon which integrated circuits are fabricated. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

This primary beam of electrons is rastered across the surface of the object, and as it does so, so-called secondary electrons are emitted from the surface at characteristic angles and energies. These secondary electrons are received by one or more detection devices of some sort, which—in correlation with the scan pattern of the primary beam—are interpreted as various characteristics of the sample.

One such detector is comprised of one or more crystals of a material that scintillates when it is struck by an electron, such as yttrium aluminum perovskite, commonly referred to as YAP, or yttrium orthosilicate, commonly referred to as YSO, or any similar scintillating material. Thus, these scintillation crystals produce photons as they are struck by electrons. The photons are routed from the scintillation crystal to a photomultiplier tube via a light pipe. The photomultiplier tube receives the photons and multiplies—or in other words amplifies—the signal represented by the photons. This signal is received and interpreted by control and analysis electronics, and an image of the object is generated.

Unfortunately, there are many ways in which the primary signal, as represented by the original electron that strikes the scintillation crystal, can be diminished or lost. Further, there are many ways in which stray signals, otherwise known as noise, can be introduced into the signal path. Both of these effects tend to reduce the signal to noise ratio of the scintillation channel, which for the purposes of this disclosure is defined as those elements of an instrument from the scintillation crystal to the photomultiplier tube.

For example, it is difficult for photons generated within the scintillator to escape across the back surface, even if this surface is roughened and a coupling epoxy is present. There is also cross-channel signal exchange between light and dark field signals, light loss due to the acceptance angle of the fiber bundle, losses due to packing of the fibers and their cladding, absorption of light by the fiber, and losses due to poor coupling from the end of the fiber to the window and the photomultiplier tube. In all, only a few percent of the light generated in the scintillator actually makes it to the photomultiplier tube.

Further, the low efficiency of current detectors, at only several percent, necessitates the use of high beam currents and long exposures, increasing sample contamination (burn/carryover) and reducing throughput. In addition, cross-channel interactions causes a reduction in separation between the various detectors, mixing the bright field and dark field images, and reducing the effective dark field angle of the detector.

What is needed, therefore, is a system by which problems such as those described above are reduced, at least in part.

SUMMARY

The above and other needs are met by a signal conduction channel having a first element that receives electrons at a first end from a vacuum environment, produces photons as the electrons are received, and propagates the photons along a length of the first element to a distal second end, and a second element that receives the photons from the second end of the first element, converts the photons to electrons, and multiplies the electrons, where no additional element is disposed between the second end of the first element and the second element, except optionally at least one of a photon-conductive epoxy, a lens, and an optical coupling plate that touches both the second end of the first element and the second element.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
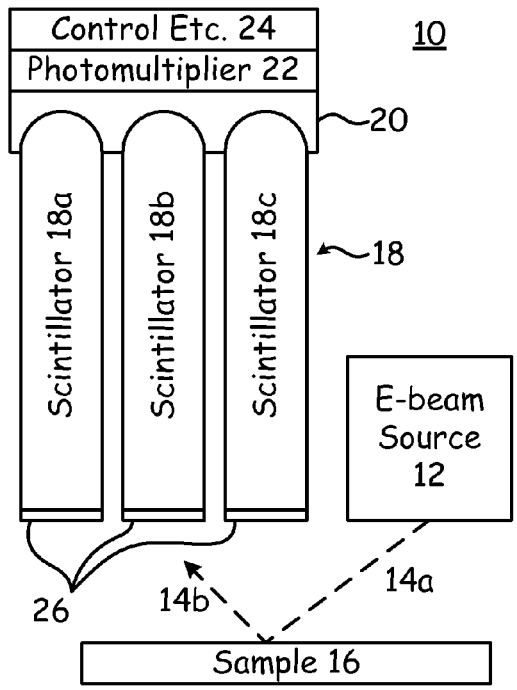
FIG. 1 is a diagram of a system according to a first embodiment of the present invention.

With reference now to FIG. 1, there is depicted an embodiment of an instrument 10. The instrument 10 as depicted in the figures is a very general embodiment of a scanning electron microscope. However, this is an exemplary embodiment, and other instruments also receive benefits from the improvements as described herein, which are not limited to the specific case of an electron microscope.

Figure 4:
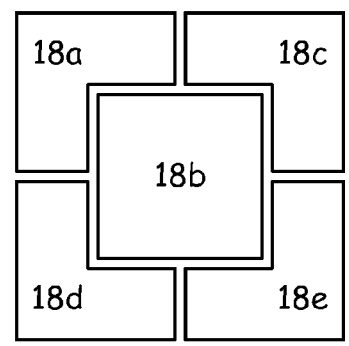
FIG. 4 is a diagram of a scintillation crystal channel configuration according to a first embodiment of the present invention.

However, with continued reference to the case of an electron microscope, a primary electron beam 14a is generated by an electron beam source 12, and directed toward a sample 16, from which secondary electrons 14b are expelled. The secondary electrons 14b are received and sensed by one or more scintillators 18. FIG. 1 depicts a segmented scintillator 18, having at least three parts, 18a, 18b, and 18c. However, the scintillator 18 could be a single block of crystal, or have more than three portions, such as is depicted in FIG. 4, where a bright field channel 18b of scintillator material is surrounded by four dark field channels 18a, 18b, 18c, and 18d of scintillator material. The scintillator material is YAP or YSO in some embodiments, or some other scintillating material in other embodiments.

The scintillator 18 is, in one embodiment, ground to a rounded lens-like feature at the distal end of the scintillator 18 from that which receives the secondary electrons 14b. In this manner, a separate lens between the scintillator 18 and the photomultiplier 22 is not required, which tends to decrease the loss of photons between the scintillator 18 and the photomultiplier 22.

Figure 2:
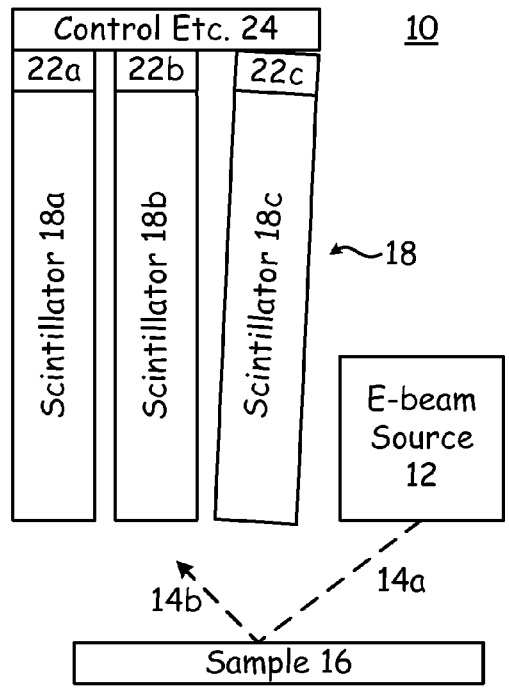
FIG. 2 is a diagram of a system according to a second embodiment of the present invention.
Figure 3:
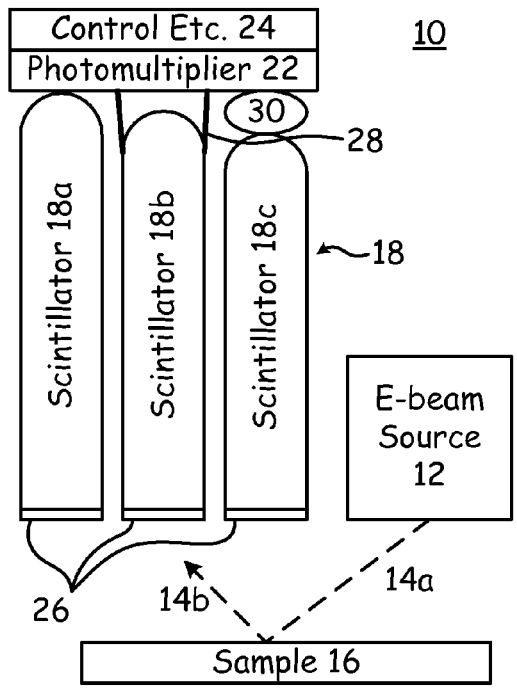
FIG. 3 is a diagram of a system according to a third embodiment of the present invention.

Another embodiment that tends to reduce photon loss is the use of a coupling plate 20 that fits against the distal end of the scintillator 18 and couples the scintillator 18 to the photomultiplier 22, as depicted in FIGS. 2 and 3 (18a in FIG. 3). A light-conductive epoxy is used between the elements in various embodiments. In the embodiment depicted in FIG. 1, the photomultiplier 22 is preferably a multi anode photomultiplier 22, such that several scintillators 18a, 18b, and 18c can be coupled to the multi anode photomultiplier 22 without confounding the bright field and dark field channels that are established by the several scintillators 18.

In some embodiments the receiving ends of the scintillators 18 are coated with aluminum 26, to aid in the reflection of photons down along the scintillators 18 toward the photomultiplier 22, and for other benefits. If used, the aluminum coating 26 is preferably about fifty nanometers in thickness. In some embodiments, the sides of the scintillators 18 are coated with aluminum, at a thickness that is preferably much more than about fifty nanometers in thickness.

In these embodiments, the scintillator 18 acts as a light pipe and lens, and thus additional light pipes, fibers, and lenses are not required. This configuration uses the high index of refraction of the scintillator 18 to an advantage, since the focal point of this built-in lens is extremely short, and allows the photomultiplier tube 22 to be placed right up to the surface of the scintillator 18a, as depicted in FIG. 3. It also allows more of the photons within the scintillator 18 to be captured by the photomultiplier tube 22, since there is a surface at the receiving end of the scintillator 18, normal to all of the angles that are transmitted through the scintillator 18.

If necessary, a light pipe could be inserted between the scintillator 18 and the photomultiplier tube 22. However, light absorption within the scintillator 18 is about one percent per five meters. This makes a nominal one-inch piece of scintillator 18 extremely efficient for conducting light. However, if absorption within the scintillator 18 is much greater than this, then a transition from the scintillator 18 to a light pipe can be made at a position that is closer to the receiving end of the scintillator 18.

Additional light collection efficiency is obtained in some embodiments by placing a reflector 28 around the ground lens portion of the scintillator 18b, or placing a powerful lens 30 (such as a spherical lens) between the scintillator 18c ground end and the photomultiplier tube 22, both as depicted in FIG. 3. This is especially useful when a compact photomultiplier tube 22 with reduced active area is used.

Advantages of the proposed system over existing systems are several-fold. Improved light collection efficiency results in reduced sample exposure to the electron beam 14a, and a proportionately lower rate of sample 16 carbonization. In addition, sample 16 charging or throughput could be greatly improved by utilizing either reduced current for the same exposure time (less charging), or similar beam 14a current for a shorter period of time (greater throughput).

In various embodiments according to the present invention, a thick scintillator 18 stands off the applied bias between the secondary electrons 14b and the photomultiplier tube 22. The scintillator 18 is also segmented to maximize dark field separation, such as depicted in FIG. 4. The space between each scintillator 18 segment or channel 18a-18d is preferably at vacuum, which produces an excellent numerical aperture for each channel, due to the high index change along the vacuum/scintillator 18 interface. There is preferably only one glued interface, at the window between the scintillator 18 and the photomultiplier tube 22, as depicted in FIG. 2, which depicts separate photomultiplier tubes 22a, 22b, and 22c in this embodiment. Even allowing for the reduced numerical aperture of the coupling epoxy and the photomultiplier tube 22 window, both a simple analytical estimate and mathematical modeling indicate a transmission of more than about thirty percent of the light from the scintillator 18 to the photomultiplier tube 22. Dark field separation is also excellent.

In other variations, chamfering is provided along the edge of the aluminized side of the scintillator 18, which further increases the amount of light that is directed along the scintillator 18 to the photomultiplier tube 22. Roughening at the non-aluminized side of the scintillator 18 increases transmission through the coupling epoxy to the photomultiplier tube 22, and does not detrimentally reduce dark field separation, since the scattering occurs at the very end of the optical chain. Introducing a non-contacting absorbing material between the scintillator segments 18a-18d reduces cross talk between the channels. The surface of this absorbing material is preferably quite rough, to prevent coupling to the scintillator, and to reduce the total internal reflectance along the channel edges. Making this separator out of a white reflective material tends to scatter the light back into each channel 18a-18d, improving transmission efficiency. Utilizing a segmented scintillator 18, with each section 18a-18d bonded to an individual channel of sapphire tends to eliminate cross-talk, but introduces an additional interface along the detector light chain. The risk is that light self-absorption will occur along the length of the scintillator 18. However, this risk is relatively low, as the absorption is only a few percent for a scintillator channel 18a-18d that is less than about one centimeter in length. The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A signal conduction channel, comprising:
   a first element that receives electrons at a first end from a vacuum environment, produces photons as the electrons are received, and propagates the photons along a length of the first element to a distal second end, and
   a second element that receives the photons from the second end of the first element, converts the photons to electrons, and multiplies the electrons,
   where no additional element is disposed between the second end of the first element and the second element, except optionally at least one of a photon-conductive epoxy, a lens, and an optical coupling plate that touches both the second end of the first element and the second element.

2. The signal conduction channel of claim 1, wherein the first element is formed of a scintillating material.

3. The signal conduction channel of claim 1, wherein the first element is formed of at least one of YAP and YSO.

4. The signal conduction channel of claim 1, wherein the length of the first element is sufficient to provide a bias standoff between the electrons received at the first end of the first element and the second element.

5. The signal conduction channel of claim 1, wherein the length is about one inch.

6. The signal conduction channel of claim 1, wherein the second end of the first element is touching the second element.

7. The signal conduction channel of claim 1, wherein the second end of the first element is formed into a convex lens.

8. The signal conduction channel of claim 1, wherein the second end of the first element is formed with a roughened surface.

9. The signal conduction channel of claim 1, wherein the first element has edges along the length, and the edges of the first element are chamfered.

10. The signal conduction channel of claim 1, wherein a reflective shield is placed around the second end of the first element, forming a photon path between the second end of the first element and the second element.

11. The signal conduction channel of claim 1, wherein the first end of the first element and sides of the first element along the length of the first element are mirrored.

12. The signal conduction channel of claim 1, wherein the first end of the first element and sides of the first element along the length of the first element are mirrored with aluminum.

13. The signal conduction channel of claim 1, wherein the first end of the first element is mirrored with about fifty nanometers of aluminum and sides of the first element along the length of the first element are mirrored with more than fifty nanometers of aluminum.

14. The signal conduction channel of claim 1, wherein the first element is coated with a white reflective material along the length.

15. The signal conduction channel of claim 1, wherein the first element is formed in a plurality of first elements, each of the plurality of first elements extending along the length from the first end to the second end.

16. The signal conduction channel of claim 1, wherein the first element is formed in a plurality of first elements, each of the plurality of first elements extending along the length from the first end to the second end, where the plurality of first elements are separated one from another with a non-contacting, photon-absorbing material.

17. The signal conduction channel of claim 1, wherein the first element is formed in a plurality of first elements, each of the plurality of first elements extending along the length from the first end to the second end, where the plurality of first elements are separated one from another with a contacting element having a roughened surface.

18. The signal conduction channel of claim 1, wherein the first element is formed in a plurality of first elements, each of the plurality of first elements extending along the length from the first end to the second end, where the plurality of first elements do not touch one another along the length.

19. The signal conduction channel of claim 1, wherein the first element is formed in a plurality of first elements, each of the plurality of first elements extending along the length from the first end to the second end, with a vacuum environment established between the plurality of first elements.

20. The signal conduction channel of claim 1, wherein the first element is formed in five first elements, each of the plurality of first elements extending along the length from the first end to the second end, the five first elements disposed with a center bright field channel, and four peripheral dark field channels formed around the center bright field channel.

21. The signal conduction channel of claim 1, wherein:
the first element is formed in a plurality of first elements, each of the plurality of first elements extending along the length from the first end to the second end, with a vacuum environment established between the plurality of first elements, and
the second element is formed in a plurality of second elements, each of the plurality of second elements associated with one of the plurality of first elements, the associated pairs of first elements and second elements disposed so as to preserve separate light field and dark field channels.

22. The signal conduction channel of claim 1, wherein the second element is a photomultiplier tube.

23. An electron microscope having the signal conduction channel of claim 1.

* * * * *